United States Patent

Machida et al.

[11] Patent Number: 5,431,124
[45] Date of Patent: Jul. 11, 1995

[54] RUTILE SINGLE CRYSTALS AND THEIR GROWTH PROCESSES

[75] Inventors: Hiroshi Machida, Kumagaya; Tsuguo Fukuda; Keigo Hoshikawa, both of Sendai, all of Japan

[73] Assignee: Chichibu Cement Co., Ltd., Japan

[21] Appl. No.: 182,574

[22] Filed: Jan. 18, 1994

Related U.S. Application Data

[63] Continuation of Ser. No. 891,937, May 29, 1992, abandoned.

[30] Foreign Application Priority Data

| May 30, 1991 | [JP] | Japan | 3-155659 |
| Aug. 12, 1991 | [JP] | Japan | 3-226511 |
| Aug. 12, 1991 | [JP] | Japan | 3-226512 |
| Oct. 17, 1991 | [JP] | Japan | 3-298241 |

[51] Int. Cl.⁶ ............................................. C30B 15/34
[52] U.S. Cl. ........................................ 117/16; 117/23; 117/209; 117/937
[58] Field of Search ............ 156/620.1, 620.71, 620.73, 156/620.74; 422/246, 253; 117/16, 23, 209, 937

[56] References Cited

U.S. PATENT DOCUMENTS

| 3,650,703 | 3/1972 | Labelle, Jr. et al. | 23/301 |
| 3,826,625 | 7/1974 | Bailey | 23/301 |
| 3,870,477 | 3/1975 | Labelle, Jr. | 156/608 |
| 4,099,924 | 7/1978 | Berkman et al. | 422/246 |
| 4,184,907 | 1/1980 | Yates | 422/246 |
| 4,213,940 | 7/1980 | Zerbst | 156/608 |
| 4,944,925 | 7/1990 | Yamauchi et al. | 156/608 |

FOREIGN PATENT DOCUMENTS

| 48-27593 | 8/1973 | Japan . |
| 62-270500 | 11/1987 | Japan . |
| 2-5720 | 2/1990 | Japan . |
| 3-12397 | 1/1991 | Japan . |

OTHER PUBLICATIONS

English Abstract of Japan Publication No. JP62091487, "Production of Dielectric Single Crystal" (Japan Publication Date Apr. 25, 1987).
*Applied Physics*, vol. 46, No. 9, pp. 938–942 (1977).
Nassau, *Journal of the American Ceramic Society*, vol. 45, No. 10, pp. 474–478 (1962).

*Primary Examiner*—R. Bruce Breneman
*Assistant Examiner*—Felisa Garrett
*Attorney, Agent, or Firm*—Zarley, McKee, Thomte, Voorhees, & Sease

[57] ABSTRACT

A rutile single crystal with no grain boundaries of large inclination is obtained by an EFG crystal growth process wherein a die provided with slits is incorporated in a feed melt 2 to deliver up the melt through the slits until it reaches the upper face of the die, thereby obtaining a single crystal conforming in configuration to the die by pulling growth.

6 Claims, 3 Drawing Sheets

RUTILE SINGLE CRYSTALS AND THEIR GROWTH PROCESSES

This is a continuation of application Ser. No. 07/891,937, filed May 29, 1992 now abandoned.

BACKGROUND OF THE INVENTION

1. Field of the Invention

The present invention relates to a futile single crystal with no grain boundaries (of large angles) and to a futile single crystal growth process by the edge-defined filmfed growth (EFG) method.

2. Description of the Prior Art

Rutile single crystals, known as polarizer material, are now produced as by the floating zone—FZ—method (cf. Japanese Patent Publication No. 61-101495) or Verneuil method. The crystals obtained by these methods are of about 10 to 25 mm in diameter, and have grown along their c-axis. In most cases, various forms of polarizers may then be made by cutting the single crystals—which have grown along their c-axis—at some angles with respect to the c-axis and further processing the plate crystals.

As well known in the art, on the other hand, the EFG method is a crystal growth method, by which some compounds inclusive of saphire and $\beta$-alumina can be pulled up into single crystals conforming in shape to dies which may take on ribbon, round rod, cylinder or other desired forms. This principle is illustrated in FIG. 1. As illustrated, a melt 2 is filled in a crucible 1 incorporating a slit die 3. The melt 2 ascends through and along slits 4 (which may be poresin some cases) in the slit die 3 by capillary action, and reaches the upper face of the die 3, where it is seeded with a seed crystal 5. Then, while cooled, the melt 2 is pulled up at a constant rate to obtain a single crystal conforming in shape to the die. Note that reference numeral 6 represents a growing crystal.

As observed under a polarization microscope, crystals grown by the FZ or Verneuil method have so increased a temperature gradient on the crystal growth interface that they can easily include grain boundaries around or in them. The grain boundaries detectable by a polarization microscope are those of large angles ("Applied Physics", Vol. 46, No. 9, pp. 938-942). Portions of crystals containing such boundaries cannot be used as polarizer material. In order to process such conventional crystals into polarizers, etc., there is needed a step of removing grain boundaries of the large angles portions out of the crystals by cutting to obtain single crystals of good quality. The conventional crystals, as a whole, are not single crystals of good quality; that is, the yield of single crystals is too low to curtail material costs. These are major factors that make it unfeasible to reduce the cost of rutile polarizers and that render it difficult to cut down the cost of isolators as well, which are in great demand as optical communications are more prevailing than ever before.

To prepare futile polarizers with practically usable faces and morphologies, it is desired that crystals with desired morphologies be grown at a certain angle with respect to their c-axis, because this makes it achievable to simplify the later processings of the crystals with high efficiency and curtail the production cost of rutile polarizers. It is thus desired that rutile single crystals be grown at a certain angle with respect to their c-axis.

However, the thermal conductivity and anisotropy of rutile single crystals are higher in their c-axis direction than in other directions; that is, some difficulty is encountered in growing crystals in those directions by the FZ method or Verneuil method now usually available in the art. Although it is believed that EFG crystal growth is effective to this end, never until now is there any report that rutile single crystals have successfully be made by the EFG method. Essentially required for the EFG method is the material of a die through which a melt is delivered up by capillary action. In addition, that die material should not be subject to serious corrosion by the melt.

It is therefore one object of the invention to provide a rutile single crystal which, as a whole, can be used as polarizer material and processed into rutile polarizers more easily than ever before.

Another object of the invention is to provide a rutile single plate crystal growth process making use of the EFG method.

SUMMARY OF THE INVENTION

According to one aspect of this invention, there is provided a rutile single crystal which is grown from a melt composed mainly of titanium dioxide and in which no grain boundaries of large angles are found.

According to another aspect of the invention, there is provided an EFG crystal growth process in which a slit die is dipped in a feed melt in a crucible held in a high-temperature furnace having a controlled atmosphere therein to cause the melt to go up through and along the slits up to the upper face of the die, thereby pulling up a single crystal conforming in shape to the die, characterized in that the feed melt is composed mainly of titanium dioxide.

Preferably, the slit die used is made up of Ir.

Preferably, the feed melt has a composition of $TiO_{2-x}$ where $x=0-0.15$.

Preferably, the partial pressure of oxygen in the controlled growth atmosphere lies in the range of $2 \times 10^{-6}$ to $5 \times 10^{-2}$ atm.

Preferably, crystal pulling takes place along the c-axis or at an angle of 10°-90° with respect to the c-axis.

Preferably, crystal pulling takes place at a rate of 30 mm/h or lower.

Preferably, the slits account for 80% or less of the area of the upper face of the die.

Preferably, the die used is designed such that its upper end portion controls the shape of a growing crystal, the face of said upper end portion being smaller than the die body.

Preferably, the crucible used has an aspect (height to diameter) ratio of 0.25 to 0.75.

Preferably, the growth atmosphere has an oxygen partial pressure lying in the range of $2 \times 10^{-6}$ to $5 \times 10^{-2}$ atm, and provides a temperature gradient of at most 5° C./cm across the upper face of the die and of 20° to 300° C./cm above the upper face of the die and along the crystal pulling direction.

BRIEF DESCRIPTION OF THE DRAWINGS

The invention will now be explained more specifically but not exclusively with reference to the accompanying drawings, in which.

GENERAL DESCRIPTION OF THE INVENTION

Figure 1:
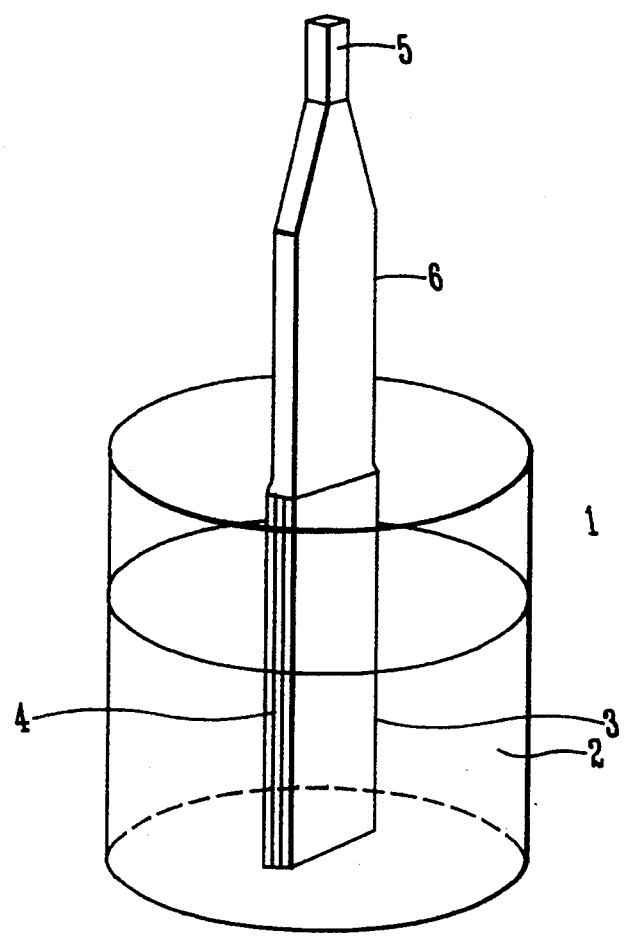
FIG. 1 represents the principle of the EFG method.

To reduce compositional variations of the feed melt it is required to reduce or limit its temperature variations, and to reduce thermal strains in a growing crystal it is required to reduce or limit the temperature gradient across the growing crystal in the vicinity of the growth interface.

Selected to meet such requirements according to this invention is the so-called EFG crystal growth process in which a slit die is dipped in a feed melt in a crucible held in a high-temperature furnace having a controlled atmosphere therein to cause the melt to ascend through and along the slits up to the upper face of the die, thereby pulling up a single crystal conforming in shape to the die. The EFG crystal growth process has some advantages. Among them:

crystal growth occurs from the melt reaching the upper face of the die, so that the quantity of a melt portion having a free surface in the vicinity of the crystal growth interface can be reduced;

the melt is in contact with the die having an increased thermal conductivity, making it possible to narrow the temperature distribution in the meniscus defined between the seed crystal and the upper face of the die; and the obtained crystal can conform in sectional shape to the upper face of the die; that is, it can be allowed to have a sectional shape enough to increase the efficiency of heat radiation from the growing crystal and reduce temperature variations, e.g., can be made in a thin plate form. These merits are the main reason why the EFG crystal growth process is selected to carry out the invention.

A problem involved with usual EFG rutile growth processes, however, is that the melts suffer from large temperature variations in the growing crystal, thus likely to give polycrystals or crystals of varying shape. For instance, cracks or boundaries of large angles grow in the resulting crystals due to their increased width variation. Rutile single crystal pulling growth, on the other hand, is characterized in that transfer of heat from the growing crystal is too limited to make crystal growth unstable for the following reasons. Rutile crystals, because of being grown from an oxygen-free melt, are likely to suffer from an insufficiency of oxygen; they are likely to absorb infrared rays due to formation of oxygen defects. In other words, the rutile crystals limit transfer of heat therefrom and so decrease in the effective thermal conductivity.

This means that for stable growth it is required to increase the temperature gradient of a growth atmosphere in the vicinity of the crystal growth interface. In that case, however, there is a increase in the rate of supercooling of the melt on the crystal growth interface, which may otherwise make the rate of crystal growth too high, albeit temporarily. There is an increase in the temperature gradient across the growing crystal on the growth interface as well. Consequently, it is likely that defects—which lead to cracks or boundaries of large angles—may be induced in the crystal.

It has now been found that the factors affecting the growth of futile single crystals by the EFG method are the temperature gradient of the growth atmosphere across the upper face of the die, the temperature gradient of the growth atmosphere along the crystal pulling direction and the partial pressure of oxygen in the growth atmosphere, and that rutile single crystals with no grain boundaries of large angles can be obtained by optimization of those factors, thereby limiting the temperature variations of the melt on top of the die and decreasing the temperature gradient within the growing crystal in the vicinity of the growth interface.

Decreasing the temperature gradient of the growth atmosphere across the die's upper face reduces the degree of convexity of the crystal growth interface with respect to the die's upper face and a difference by location in the sectional and upper face configurations of the growing crystal and die, respectively, so that the temperature variation of the melt and, hence, the shape variation of the crystal can be limited. The temperature gradient of the growth atmosphere along the crystal pulling direction and the partial pressure of oxygen around the growth interface are such regulated as to create an environment in which oxygen is easily diffused from the growth atmosphere into the growing crystal in the vicinity of the crystal growth interface. This makes the resultant single crystal less likely to absorb infrared rays and have so increased a thermal conductivity that heat can transfer easily from it. In other words, it is possible to reduce the temperature gradient of the melt in the vicinity of the crystal growth interface and so the degree of supercooling of the melt on the crystal growth interface, thereby preventing the rate of crystal growth from becoming too high. As well known in the art, the behavior of oxygen diffusion in a growing rutile crystal varies depending on what temperature it is at, and at about 1000° C. or higher the diffusion of oxygen from within the growing crystal into the atmosphere becomes predominant, while at lower than that the diffusion of oxygen from the atmosphere into the growing crystal does so. In addition, since there is a logarithmic relation between oxygen diffusion time and distance, the thinner the crystal, the shorter the diffusion time. In fact, a plate form of rutile single crystal obtained by the EFG method is found to have no or little oxygen defects and be transparent in a visible range, even when it is carried out in an atmosphere having an oxygen partial pressure at which conventional CZ growth methods would give oxygen-deficient crystals.

Regarding the temperature gradient of the growth atmosphere along the crystal pulling direction, however, it is noted that increasing that temperature gradient results in increases in both the rate of cooling of the growing crystal and the temperature gradient across the growing crystal, making thermal strains and cracks likely to occur in the crystals and so rendering it difficult to produce single crystals of good quality. This explicitly indicates that there is a proper temperature range as to the temperature gradient of the growth atmosphere along the crystal pulling direction. In other words, it is when the temperature gradient of the growth atmosphere across the die's upper face, the temperature gradient of the growth atmosphere along the crystal pulling direction and the partial pressure of oxygen in the growth atmosphere are in the respective ranges of at most 5°0 C./cm, 20°-300° C./cm and $5 \times 10^{-2} - 2 \times 10^{-6}$ atm that rutile single crystals with no grain boundaries of large angles can be obtained by the EFG method.

Die Material

One important factor for this invention is die material. Some dies were built up of iridium (Ir), molybdenum (Mo) and tungsten (W). By experimentation, Mo and W dies were found to be unsuitable for the invention. This is because although the ruitle melt was somehow delivered up through the slits by capillary action, it reacted with Mo and W, doing damage to the dies as well as the crucibles. An Ir die, by contrast, was found to be suitable for the growth of rutile single crystals according to the EFG method, because the melt was well delivered up through the die by capillary action and reached the upper face thereof without reacting with Ir. It was also noted that Ir dies having rectangular and round upper faces gave rutile single crystals conforming in sectional shape thereto.

In another experiment, an Ir die having a rectangular upper face was used for the growth of crystals at angles varying from 0° to 90° with respect to their c-axis. As a result, it was shown that single crystals of good quality could be obtained when growth occurred along the c-axis or at angles lying in the range of 10° to 90° with respect to the c-axis. Similar results were also obtained regarding the a- and b-axes.

Melt Composition

The above-mentioned experiments were all done with the starting material composed of $TiO_2$ in a growth atmosphere with the oxygen partial pressure kept at $2 \times 10^{-2}$ atm. In consideration of the fact that in the growth of rutile single crystals by the EFG method there are variations in melt composition, investigation was made of crystallinity changes due to the composition of the starting material. To this end, various starting materials consisting of $TiO_{2-x}$ where $x=0-0.3$ were used, while the rate of solidification of melt with respect to its quantity was kept constant, thereby obtaining single crystals. Observation of the crystals under a polarization microscope indicated that some melts in the x value range of 0 to 0.15 all gave single crystals, but some melts departing from that range changed from a single to polycrystal state in the course of growth.

Oxygen Partial Pressure

It is expected that melt composition variations are affected by variations in the oxygen partial pressure value of the growth atmosphere. To investigate this, EFG crystal growth was done in an atmosphere with the oxygen partial pressure controlled between 0 and $7 \times 10^{-2}$ atm. Consequently, it was observed that die configuration and the crystallinity of the resulting crystals varied with oxygen partial pressure changes. At an oxygen partial pressure of $2 \times 10^{-6}$ to $5 \times 10^{-2}$ atm, however, there was neither change in the profile and degree of horizontalinality of the dies' upper face nor variation in slit shape. The obtained crystals at that partial pressure were further heat-treated at a certain temperature in a certain atmosphere for observation of their crystallinity under a polarizer microscope, which revealed that there was no change in crystallinity due to the oxygen partial pressure. At an oxygen partial pressure $5 \times 10^{-2}$ atm or higher, however, the die was changed in its upper face shape and roughened on its surface, with the result that many defects were induced on and in the crystal.

At an oxygen partial pressure lower than $2 \times 10^{-6}$ atm, the die remained unchanged in shape, but as the concentration of oxygen defects in the crystal increased because of too low a concentration of oxygen in the growth atmosphere, there was a decrease in the apparent thermal conductivity of the crystal. This gave rise to serious variations in crystal shape, made shape control difficult and caused the crystal to induce grain boundaries or cracks in it.

This teaches that the changes in the crystallinity of the crystal, which are caused by melt composition variations incidental to growth, can be prevented by regulating the oxygen partial pressure of the crystal growth atmosphere used within the range of $2 \times 10^{-6}$ to $5 \times 10^{-2}$ atm and limiting the composition of the starting melt material to $TiO_{2-x}$ where $x=0-1.5$.

Crystal Pulling Rate

An increased crystal pulling rate gives rise to an increase in the latent heat for solidification per unit time and, hence, an increase in the amount of heat carried into a growing crystal. As the crystal pulling rate is increased under other growth conditions kept constant, crystal growth becomes unstable, because the crystal growing on the growth interface is so increased in temperature that there are melt and die temperature rises, resulting in an increase in crystal width, etc. Generally speaking, these problems may be solved by increasing the temperature gradient in the vicinity of the crystal growth interface in association with an increase in the crystal growth rate to increase the amount of heat radiation from the growing crystal or lowering the output of high-frequency oscillation, thereby lowering the temperatures of the die's upper end and melt. However, increasing the temperature gradient across the crystal growth interface makes the crystal cooling rate so high that thermal strains are likely to occur in the crystal, resulting in the degradation of crystallinity of the crystal. There is also a certain limit on lowering the output of high-frequency oscillation, because a melt has a lower critical temperature referred to as a melting point. For those reasons, a certain upper limit is placed on the crystal pulling rate so as to achieve stable crystal growth. By experimentation, that upper limit was found to lie at 30 mm/h.

Temperature of Die's Upper End

Characteristic of the growth of a plate crystal using a die is that the die itself serves to compensate for temperature—a so-called self-temperature compensation effect; when the temperature of the die's upper end exceeds a certain point, it decreases with a decrease in the width of a growing crystal, causing the die to reach a temperature suitable for crystal growth. This enables the range of the output of high-frequency oscillation making stable crystal growth possible to be wider than would be possible with the CZ method. For this reason, it is understood that the larger the portion of the die's upper face that takes part in the self-temperature compensation effect, i.e., the portion of the die's upper face except slits, the more stable the crystal growth will be. By experimentation, it is shown that the ratio of the effective area of the upper face, where this effect occurs, with respect to the total area thereof lies at 80% or less, although expected to vary more or less depending on the area of the upper face.

Temperature Difference Across Die's Upper Face

As there is a large temperature difference between the central and peripheral regions of a die, much difficulty is involved in stable crystal growth, because the convex region of crystal growth interface shape with respect to the die increases in magnitude. To achieve the stable growth of a crystal controlled in shape, it is thus required to limit the temperature distribution across the upper face of the die. FIG. 2(a) is a side sectional view of a die in standard shape. As is the case with the FIG. 1 arrangement, the die is provided with a slit 4. A problem with the FIG. 2(a) die is that because of a large temperature difference between the central and peripheral regions of its upper face, a large variation is likely to occur in crystal shape during growth, because the sides of the die are easily subject to high-frequency induction heating but the upper face of the die is not.

Figure 2A:
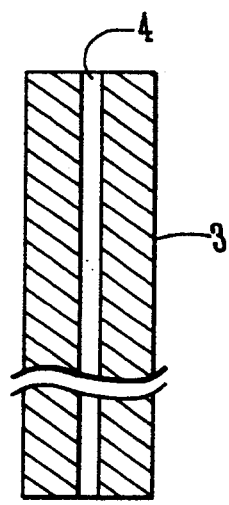
FIG. 2(a) and (b) are side sectional views of the die used in the invention.
Figure 2B:
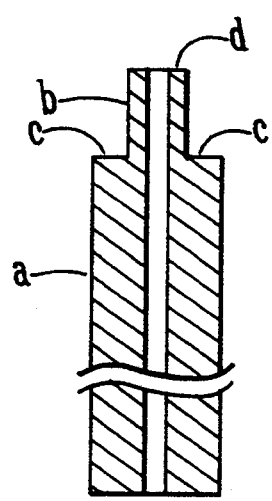

This problem can be solved by using such a die arrangement—in which the upper end face is smaller than the die body—as shown in FIG. 2(b) which is designed to limit the temperature distribution within a plane defined by the upper end of the die and so make shape control easy. The reason is that planes a and b are easily subject to high-frequency induction heating but planes c and d are not; that is, a temperature rise of the peripheral region of the upper face (plane d) of the die is so reduced that the temperature difference between it and the central region of the upper face of the die can be limited. As can be seen from FIG. 2(b) the temperature distribution across the plane defined by the upper end of the die can be limited by forming the upper end of the die in convex shape and allowing the convex portion to be contiguous to the side planes a of the die through the horizontal planes c. However, the higher the convex portion, the more easily are the planes b subject to the induction heating and so the higher the temperature of the peripheral portion of the upper face of the die, thus less effective on limiting the temperature distribution across the surface defined by the upper end of the die. In other words, a certain upper limit should be placed on the height of the convex portion so as to achieve stable crystal growth. To this end, the relationship between the maximum crystal pulling rate at which stable crystal growth is achievable and the height of the convex portion of the upper end of the die was determined by varying the ratio of the sectional areas of the convex portion and die body. As a result, it was found that the higher the convex portion, the lower the maximum crystal pulling rate and, at the same height of the convex portion, the larger the sectional area proportion of the convex portion, the lower the maximum crystal pulling rate. Note that while the die has been described as in plate shape, it may be in round or other shape. Likewise, the horizontal planes c may be curved or inclined.

Aspect Ratio of Crucible

As the sides of a die increase in temperature, it is more difficult to place the shape of a growing crystal under control, because there is a temperature rise of the peripheral region of the die's upper face, resulting in the widening of the temperature distribution across the surface defined by the die's upper face. It is thus desired to lower the temperature of the die's upper face. The temperature of the die's upper face is governed by direct heating by high-frequency induction and heat radiation from the inner wall of the crucible and the surface of the melt. A change in die shape is considered effective for limiting high-frequency inducting heating, as has already been noted. The present invention provides means for keeping the temperature of the sides of the die from rising due to heat radiating from the crucible and the surface of the melt. Reducing the amount of heat radiated to the sides of the die is achieved by increasing the distances between the sides of the die, the inner wall of the crucible and the surface of the melt. Effective to this end is the use of a crucible having a small aspect (height/diameter) ratio. At too small an aspect ratio, however, there is an increase in the output value of high-frequency oscillation during crystal growth, which may otherwise cause a rise in the temperature of the inner wall of the crucible and, at the same time, an increase in the amount of heat applied to the sides of the die by high-frequency induction, resulting in a rise in the temperature of the side of the crucible. It is thus preferred that the crucible used have an aspect ratio lying in the range of 0.25 to 0.75.

Action of the Invention

Characteristic of the EFG method is the use of a die, the shape of the upper face of which determines crystal shape. Even when crystal pulling takes place at certain angles with the c-axis—in which case the bending of a crystal is likely to take place, the melt meniscus located below the crystal growth interface contacts at its lower end the upper face of the die and so is constrained in terms of position, so that there can be no large shape and position variations, with the result that the crystal can be prevented from bending seriously.

When compared with general crystal pulling methods, the EFG method is said to be larger in the magnitudes of both the temperature distribution around a growing crystal and the change in crystallinity due to the pulling direction. To obtain a single crystal of good quality, it is thus required to make the crystal growth rate in the pulling direction uniform. The surface roughness of the obtained crystal is likely to vary largely due to growth rate anisotropy resulting from thermal conductivity anisotropy. To obtain a plate single crystal of good quality, it is thus required to polish the surface of the crystal product.

A rutile crystal grows at the fastest rate with large anisotropy, when growth takes place along the c-axis. Thus, when crystal pulling takes place at a slight angle with the c-axis, the variation in the growth rate in the pulling direction within the growth interface is so maximized that the surface roughness of the crystal is likely to vary largely. As a result, such defects as strains, air bubbles and subgrain texture are likely to be induced in the crystal. The degree of those defects decreases as the pulling direction is off the c-axis. To verify this, the refractive index variation of crystals obtained at angles of 0° to 90° with respect to the c-axis was measured. As a result, it was found that the crystals obtained at angles of 0° and 10°–90° with respect to the c-axis were similar to those obtained by the FZ method in that their refractive index variation lay within $3 \times 10^{-6}$, indicating that they were single crystals of good quality.

Those results are due to the dependence of crystallinity on the pulling direction. As the pulling direction lies at an angle of 10° or more with respect to the c-axis, the influence the growth rate along the c-axis has on the variation in the growth rate in the pulling direction diminishes, with the result that the growth rate in the pulling direction within the growth interface is made uniform.

EXAMPLES

Regarding the growth of a plate form of futile single crystals by the EFG method, investigations were made of pulling directions, die materials and feed melt compositions. The following are the examples.

Example 1

An Ir crucible of 50 mm in diameter and 50 mm in height, in which 100 g of a feed composition $TiO_2$ were charged, was placed in a usual EFG pulling furnace such as one shown in FIG. 1. Incorporated in this crucible was a die provided with slits with a gap of 0.5 mm between them, each of 3 mm in thickness, 30 mm in width and 40 mm in height. How the melt was delivered up through the slits by capillary action was observed. As a result, it was found that although the surface of the melt was positioned about 20 mm below the upper face of the die, the melt reached the upper face of the die and spread over. It was also found that there was no change in die and slit shape at all. The crystal growth atmosphere used was an industrially available Ar gas of 99.998% or more purity.

Comparative Example 1

A Mo or W crucible of 50 mm in diameter and 50 mm in height, in which 200 g of a feed composition $TiO_2$ were charged, was placed in a furnace similar to that used in Ex. 1 to perform feed melting experiments. Incorporated into this crucible was a die of 4 mm in thickness, 20 mm in width and 40 mm in height, provided with slits with a gap of 0.5 mm between them. How the melt was delivered up through the slits by capillary action was observed. The feed composition was melted in the crucible, followed by cooling. Subsequent observation of the crucible and die indicated that the melt reached the upper face of the die through the slits, but the die surface was deformed. Repeated melting and cooling of the feed composition was found to result in die weight losses. It was thus verified that the Mo and W crucibles were unsuitable for the growth of a plate form of rutile single crystals.

Example 2

A plate form of single crystal pulling testing was done with an Ir crucible of 50 mm in diameter and 50 mm in height in which 250 g of a feed composition $TiO_2$ were charged and which was placed in a usual EFG pulling furnace such as one shown in FIG. 1. Incorporated into this crucible was a die of 3 mm in thickness, 30 mm in width and 40 mm in height, provided with slits with a gap of 0.5 mm between them. The melt delivered up through the slits was seeded with a seed crystal for the pulling growth of a single crystal. Pulling took plate along the c-axis [001] at a rate of about 10 mm/h. The location of the seed crystal was adjusted such that the (100) face parallel with the c-axis was kept in parallel with the widthwise direction of the slits. The crystal growth atmosphere used was an industrially available gas mixture of Ar and $O_2$ (2%), and was fed at a rate of 2l/min. Consequently, a plate form of single crystal of about 3 mm in thickness, about 30 mm in width and about 80 mm in length was obtained. This crystal was heat-treated at 900° C. for about 12 hours in the air and then polished on the surface into a plate single crystal of 2.6 mm in thickness. Observation of this crystal under a polarization microscope showed that there were no strains, air bubbles and subgrain texture at all, indicating that it was a single crystal of good quality. Note that the refractive index variation found was $1.0 \times 10^{-6}$.

Example 3

Using a similar hot zone arrangement similar as used in Ex. 2, crystal pulling testing was done with 250 g of a feed composition $TiO_{1.9}$ at a pulling rate of 7 mm/h. For the feed composition, a mixture of 204 g of $TiO_2$ powders and 46 g of $Ti_2O_3$ powders was calcined at about 1000° C. Crystal pulling took place following Example 2. As a result, a plate single crystal of ca. 3 mm in thickness, ca. 30 mm in width and ca. 80 mm in length was obtained. By Observation of the crystal under a polarization microscope done following Ex. 2, it was found that there was no strains, air bubbles and subgrain texture at all. This crystal was thus verified as a plate single crystal of good quality.

Comparative Example 2

Using a similar hot zone arrangement similar as used in Ex. 2, crystal pulling testing was done with 250 g of a feed composition $TiO_{1.7}$ at a pulling rate of 7 mm/h. For the feed composition, a mixture of 106 g of $TiO_2$ powders and 144 g of $Ti_2O_3$ powders was calcined at about 1000° C. Crystal pulling took place following Example 2. As a result, a plate single crystal of ca. 3 mm in thickness, ca. 30 mm in width and ca. 80 mm in length was obtained. By observation of the crystal under a polarization microscope done following Ex. 2, it was found that no strains, air bubble and subgrain texture were detected in the 50 cm long portion of the crystal, as measured from the seed crystal—which indicated that that portion was a single crystal of good quality, but the remaining portion included such defects as strains, air bubbles and subgrain texture—which indicated that that portion was not a single crystal.

Comparative Example 3

The procedures of Ex. 2 were followed with the exception that to control the partial pressure of oxygen in the growth atmospheres used, an industrially available Ar gas was mixed with $O_2$ at ratios of 100:0, 5 and 7. In each testing run, the atmospheric gas continued to flow at 2l/min until crystal growth was completed. When Ar and $O_2$ were used at ratios of 100:0 and 5, a crystal equivalent to that obtained in Ex. 2 was obtained with neither die deformation nor die degradation found. When Ar and $O_2$ were used at 100 to 7, the rectangular upper face of the die was surrounded with a curve and was roughened. Such upper face deformation gave rise to a large variation in the rate of crystal growth, and the resultant crystal was found to contain many strains and air bubbles; that is, any single crystal of good quality was not obtained.

Another experimentation was done in a growth atmosphere consisting of 100% Ar of an industrially pure grade, say, least 99.999% purity. There was no change in die shape, but difficulty was encountered in placing the rowing crystal under shape control; that is, the resultant crystal was found to include boundaries and cracks. This appears to be due to the concentration of oxygen in the growth atmosphere having been so low that many oxygen defects are induced in the growing crystal, causing the apparent thermal conductivity of the crystal to decrease. Note that the partial pressures of oxygen contained in the Ar gases of general and industrially pure grades were $2 \times 10^{-6}$ atm and $1 \times 10^{-7}$ atm, respectively.

Comparative Example 4

Using a similar hot zone as in Example 2, crystal pulling growth was carried out at an angle of 5° with respect to the c-axis and at a pulling rate of 10 mm/h. The location of the seed crystal was adjusted such that the (100) face parallel with the c-axis was kept in parallel with the widthwise direction of the slits. Consequently, a plate form of single crystal of ca. 3 mm in thickness, ca. 30 mm in width and ca. 85 mm in length was obtained, but this was found to include strains, air bubbles, subgrain texture, etc. after polished to a 2.5 mm thickness. The refractive index variation was found to be $2.0 \times 10^{-5}$ as well.

Example 4

Using a similar hot zone as in Example 2, crystal pulling growth was carried out at an angle of 60° with respect to the c-axis and at a pulling rate of 10 mm/h. The location of the seed crystal was adjusted such that the (100) face parallel with the c-axis was kept at right angles with the widthwise direction of the slits. Consequently, a plate form of single crystal of ca. 3 mm in thickness, ca. 30 mm in width and ca. 70–80 mm in length was obtained. This single crystal was polished to a thickness of 2.2 to 2.5 min. No change in the crystallinity of the single crystal due to the pulling direction was found with a refractive index variation of $1.5-2.5 \times 10^{-6}$.

Comparative Example 5

Using a similar hot zone arrangement similar as used in Ex. 2, crystal pulling testing was done with 250 g of a feed composition $TiO_{2.0}$ at pulling rates of 20, 30 and 40 mm/h. The pulling direction and atmosphere used followed Example 2. At the pulling rates of 20 and 30 mm/h a plate form of single crystals of ca. 3 mm in thickness, ca. 30 mm in width and ca. 80 mm in length were obtained, as was the case with Ex. 2. At the pulling rate of 40 mm/h, however, any single crystal of Good quality was not obtained, because there were large width and thickness variations, which resulted in formation of air bubbles or caused grain boundaries to grow from an area suffered from a large width variation.

Comparative Example 6

A plate form of single crystal pulling testing was done with an Ir crucible of 50 mm in diameter and 50 mm in height in which 250 g of a feed composition $TiO_2$ were charged and which was placed in a usual EFG pulling furnace. Incorporated into this crucible was a die provided with slits with a gap of 1.0 mm, 1.5 mm, 2.0 mm, 2.2 mm, 2.4 mm or 2.6 mm. The melt delivered up through the slits was seeded with a seed crystal for the pulling growth of a single crystal. Pulling took place along the c-axis [001] at a rate of about 10 mm/h. The crystal growth atmosphere used was an industrially available gas mixture of Ar (of ultrahigh purity) and $O_2$ (2%), and was fed at a rate of 2 l/min. With the dies having a slit width of 1.0 to 2.4 mm, a plate form of single crystals of ca. 3 mm in thickness, ca. 30 mm in width and ca. 50–80 mm in length were obtained. At the slit width of 2.6 mm, however, the output of high-frequency oscillation had to be regulated for stable crystal growth. At an increased output value there was an increased width variation, while at a decreased output value the melt solidified. Thus, no stable crystal growth took place at the slit width of 2.6 mm.

Comparative Example 7

A plate form of single crystal pulling testing was done with an Ir crucible of 50 mm in diameter and 50 mm in height in which 250 g of a feed composition $TiO_2$ were charged and which was placed in a usual EFG pulling furnace. Incorporated into this crucible was a die of 5 mm in thickness, 30 mm in width and 40 mm in height provided with slits with a gap of 2.0 mm, 2.5 mm, 2.0 mm, 3.5 mm, 4.0 mm or 4.25 mm. The melt delivered up through the slits was seeded with a seed crystal for the pulling growth of a single crystal. The crystal pulling direction and rate as well as the growth atmosphere used followed Comparative Example 6. With the dies having slit widths of 2.0–4.0 mm, a plate form of single crystals of ca. 5 mm in thickness, ca. 30 mm in width and ca. 60–80 mm in length were obtained. At the slit width of 4.25 mm, however, no stable growth took place, as was the case with the slit width of 2.6 mm in Comparative Example 6.

Example 5

Figure 3:
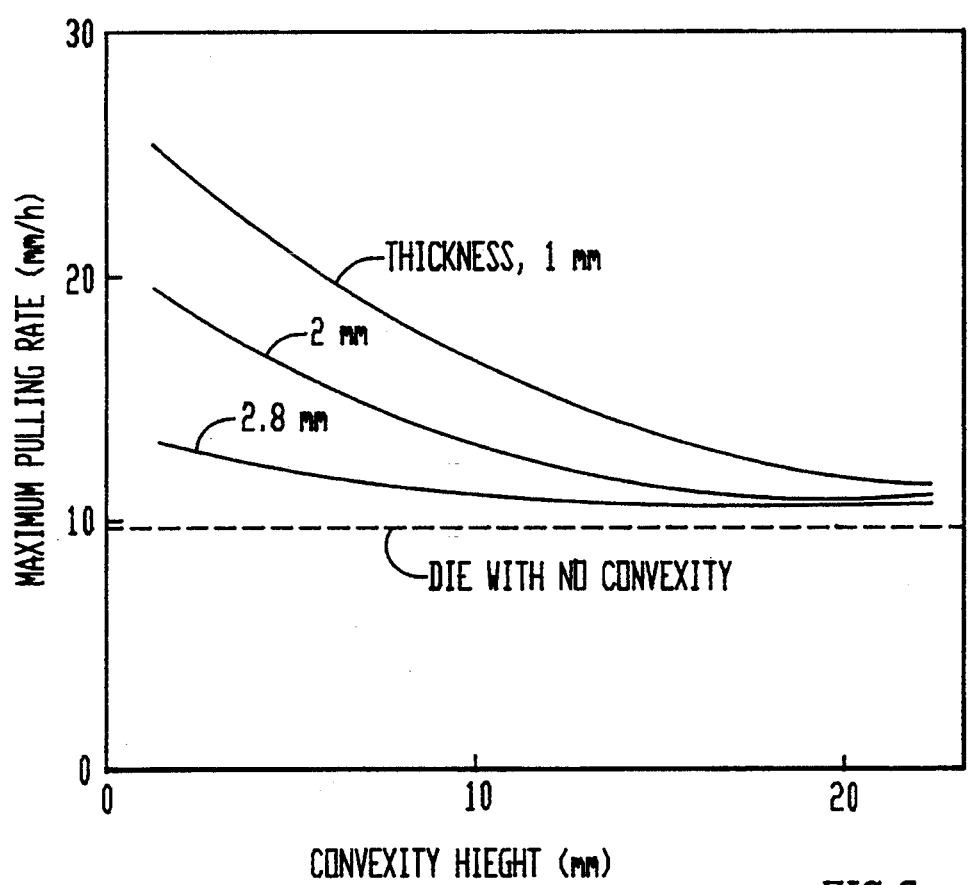
FIG. 3 is a diagram showing the relationship between the maximum pulling rate and the height of the convex end using the thickness of the die as a parameter.

A plate form of single crystal pulling growth testing was done with an Ir crucible of 50 mm in diameter and 50 mm in height, in which 125 g of a feed composition $TiO_2$ were charged and which was placed in an usual EFG pulling furnace. Incorporated in this crucible were dies provided with 0.5 mm wide slits. Each die had a convex portion of 1 mm in thickness and 0–20 mm in height, and was of 40 mm in height and 30 mm in width. The melt delivered up through the 0.5 mm wide slits by capillary action was seeded with a seed crystal for the pulling growth of a single crystal. Similar tests were performed with dies having convex portions of 2 mm and 2.8 mm in width. The maximum pulling rates enabling the plate crystals to be controlled in shape differed, and were compared with that achieved with a die of 3 mm in thickness, 30 mm in width and 40 mm in height, which was provided with slits with a gap of 0.5 mm between them. Note that the crystal pulling direction and rate as well as the growth atmosphere followed Comparative Example 6. As can be best seen from the results shown in FIG. 3, the maximum crystal pulling rate was increased by using the convex dies.

Example 6

A plate form of single crystal pulling growth testing was done with Ir crucibles of 50 mm in diameter, having aspect ratios of 1.0, 0.75, 0.5, 0.25 and 0.15, in which 250 g, 187 g, 125 g, 63 g and 38 g of feed compositions $TiO_2$ were charged and which were placed in an usual EFG crystal pulling furnace. Incorporated into the crucibles were dies which each had a thickness of 3 mm and a width of 30 mm and were each provided with slits with a gap of 0.5 mm between them, but which were 40 mm, 30 mm, 20 mm and 5 mm in height. The melts delivered up through the slits by capillary action were seeded with seed crystals for the pulling growth of single crystals. For comparison, the ranges for oscillation output values at which width variations could be limited within 5% were determined at the time when growing crystals reached a length of 20–30 mm. Note that the pulling direction and rate as well as the growth atmosphere followed Comparative Example 6. Consequently, the oscillation output value was about 1.8% and 1.5% at the crucibles' aspect ratios of 1.0 and 0.15 in contrast to 3.5–5.0% at the aspect ratios of 0.75–0.25. It was thus verified that shape control of crystals is easily achieved by using crucibles having an aspect ratio lying in the range of 0.75 to 0.25.

Example 7

A plate form of single crystal pulling testing was done with an Ir crucible of 50 mm in diameter and 50 mm in height in which 250 g of a feed composition $TiO_2$ (of 99.9% purity) were charged and which was placed in a usual EFG pulling furnace such as one shown in FIG. 1. Incorporated into this crucible was a die of 3 mm in thickness, 30 mm in width and 40 mm in height, provided with slits with a gap of 0.5 mm between them. The melt delivered up through the slits was seeded with a seed crystal for the pulling growth of a single crystal. Pulling took plate along the c-axis [001] at a rate of about 10 mm/h. The location of the seed crystal was adjusted such that the (100) face parallel with the c-axis was kept in parallel with the width direction of the slits. The crystal growth atmosphere used was an industrially available gas mixture of Ar and $O_2$ (2%), and was fed at a rate of 2 l/min. The growth atmosphere was regulated such that it provided a temperature gradient of 5° C./cm across the die's upper face and a temperature gradient of 150° C./cm above the die's upper face and along the pulling direction. Consequently, a plate form of single crystal of about 3 mm in thickness, about 20 mm in width and about 65 mm in length was obtained. This crystal was heat-treated at 900° C. for about 12 hours in the air and then polished on the surface into a thickness of 2.6 mm. Observation of this crystal under a polarization microscope showed that there were no strains, air bubbles and sub-grain texture at all, indicating that it was a single crystal of good quality. Note that the refractive index variation found was $1.0 \times 10^{-6}$.

As will be understood from what has been described, futile single crystals of no grain boundaries of large angles can be obtained by the present invention. The thus obtained rutile single crystals can, as a whole, be used as polarizer material, contributing to reducing its production cost.

What is claimed is:

1. An EFG crystal growth process, comprising:
    placing a feed melt composed of titanium dioxide, in a crucible,
    holding said crucible in a controlled atmosphere of a high temperature furnace, and
    dipping a slit die of iridium metal into said feed melt and holding said slit die of iridium metal in said feed melt until the feed melt passes up through and along the slits to the upper face of the die to pull up a single crystal conforming in shape to the die, said slits accounting for 80% or less of the area of the upper face of the die.

2. The process of claim 1, wherein said feed melt has composition of $TiO_{2-x}$ wherein x is from 1 to 0.15.

3. The process of claim 2 wherein said pulling up of said single crystal takes place either along the c-axis or at an angle of 10° to 90° with respect to the c-axis.

4. The process of claim 2, wherein said die has an upper end portion and is designed such that its upper end portion is formed as convex configuration to control the shape of the growing single crystal, the face of said upper end portion of the die being smaller in width than the lower portion thereof.

5. The process of claim 2, wherein said controlled atmosphere has an oxygen partial pressure within the range of $2 \times 10^{-6}$ to $5 \times 10^{-2}$ atm, and a temperature gradient of at most 5° C./cm across the upper face of the die end of 20° to 300° C./cm above the upper face of the die along the crystal pulling direction.

6. The process of claim 2 wherein said controlled atmosphere has an oxygen partial pressure lying in the range of $2 \times 10^{-6}$ to $5 \times 10^{-2}$ atm, and a temperature gradient of at most 5° C./cm across the upper face of the die end of 20° to 300° C./cm above the upper face of the die and along the crystal pulling direction,
    said slits accounting for 80% of less of the area of the upper face of the die;
    said slit die is designed such that its upper end portion controls the shape of a growing crystal, the face of said upper end portion of the die being smaller in width than a size of the lower portion of the die; and
    said crucible having an aspect ratio (length to diameter) of 0.25 to 0.75.

* * * * *